(12) United States Patent
Kim et al.

(10) Patent No.: US 9,947,543 B2
(45) Date of Patent: Apr. 17, 2018

(54) SEMICONDUCTOR MEMORY DEVICE AND MANUFACTURING METHOD THEREOF

(71) Applicant: SK hynix Inc., Gyeonggi-do (KR)

(72) Inventors: Tae Kyung Kim, Chungcheongbuk-do (KR); Jung Myoung Shim, Gyeonggi-do (KR); Myung Kyu Ahn, Gyeonggi-do (KR); Sung Soon Kim, Seoul (KR); Woo Duck Jung, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 71 days.

(21) Appl. No.: 14/948,937

(22) Filed: Nov. 23, 2015

(65) Prior Publication Data

US 2016/0111291 A1    Apr. 21, 2016

Related U.S. Application Data

(62) Division of application No. 13/715,504, filed on Dec. 14, 2012.

(30) Foreign Application Priority Data

Aug. 8, 2012 (KR) .................. 10-2012-0086915

(51) Int. Cl.
*H01L 21/28* (2006.01)
*H01L 29/06* (2006.01)
(Continued)

(52) U.S. Cl.
CPC ...... *H01L 21/28273* (2013.01); *H01L 21/764* (2013.01); *H01L 27/11521* (2013.01);
(Continued)

(58) Field of Classification Search
CPC ......... H01L 21/28273; H01L 29/66825; H01L 21/764; H01L 27/11521; H01L 29/0649; H01L 29/788
(Continued)

(56) References Cited

U.S. PATENT DOCUMENTS

| | | | |
|---|---|---|---|
| 2002/0158337 A1 | 10/2002 | Babich et al. | |
| 2008/0283898 A1 | 11/2008 | Kuniya | |
| 2008/0303076 A1* | 12/2008 | Van Schaijk | H01L 27/11521 257/315 |
| 2009/0170322 A1* | 7/2009 | Bok | H01L 29/66666 438/692 |
| 2009/0230456 A1* | 9/2009 | Yoon | H01L 21/823456 257/321 |
| 2009/0325369 A1* | 12/2009 | Kim | H01L 21/28247 438/585 |
| 2010/0019311 A1 | 1/2010 | Sato et al. | |
| 2010/0038731 A1* | 2/2010 | Van Kampen | B81C 1/0015 257/415 |

(Continued)

FOREIGN PATENT DOCUMENTS

CN    102479811    5/2012

OTHER PUBLICATIONS

Office Action issued by the State Intellectual Property Office dated Apr. 5, 2017.

*Primary Examiner* — Moin Rahman
(74) *Attorney, Agent, or Firm* — IP & T Group LLP

(57) ABSTRACT

The present disclosure relates to a semiconductor memory, device and a method of forming a semiconductor memory device. The method of manufacturing a semiconductor memory device, includes forming a tunnel insulation layer and a floating gate on a semiconductor substrate of an active region, forming a trench in the semiconductor substrate of an isolation region, forming, in the trench, a sacrificial layer having an upper surface positioned higher than a surface of the semiconductor substrate, forming a capping layer over the sacrificial layer, and forming an air gap by removing the sacrificial layer without removing the capping layer.

19 Claims, 15 Drawing Sheets

(51) Int. Cl.
*H01L 29/788* (2006.01)
*H01L 21/764* (2006.01)
*H01L 27/11521* (2017.01)
*H01L 29/66* (2006.01)

(52) U.S. Cl.
CPC .... *H01L 29/0649* (2013.01); *H01L 29/66825* (2013.01); *H01L 29/788* (2013.01)

(58) Field of Classification Search
USPC .......... 257/20, 194, 135–136, 213–413, 900, 257/902–903; 438/136, 137, 156, 173, 438/192, 206, 212, 424, 427, 428, 591
See application file for complete search history.

(56) References Cited

U.S. PATENT DOCUMENTS

| | | | |
|---|---|---|---|
| 2011/0303967 A1* | 12/2011 | Harari | H01L 21/764 257/321 |
| 2012/0126303 A1 | 5/2012 | Arai et al. | |
| 2012/0132982 A1* | 5/2012 | Lee | H01L 21/28273 257/321 |
| 2012/0280300 A1* | 11/2012 | Kim | H01L 27/11524 257/315 |

* cited by examiner

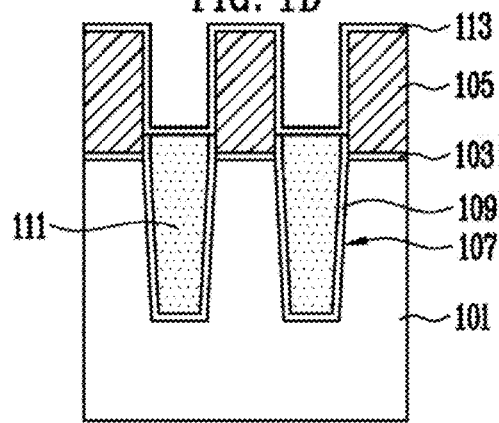
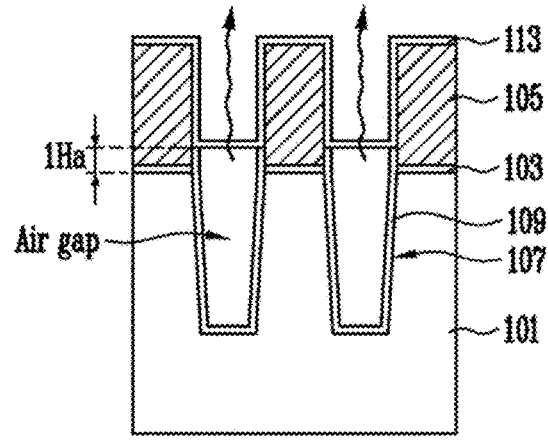
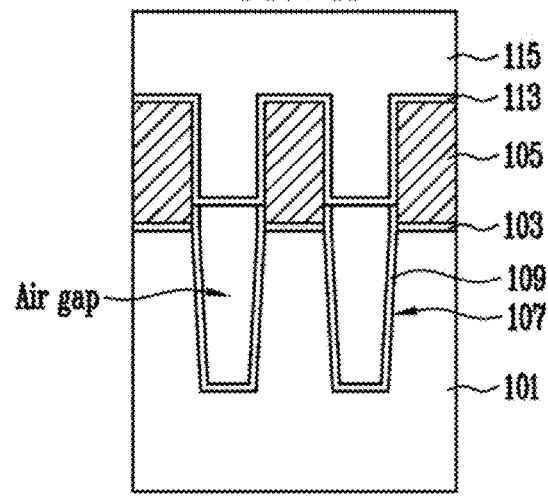

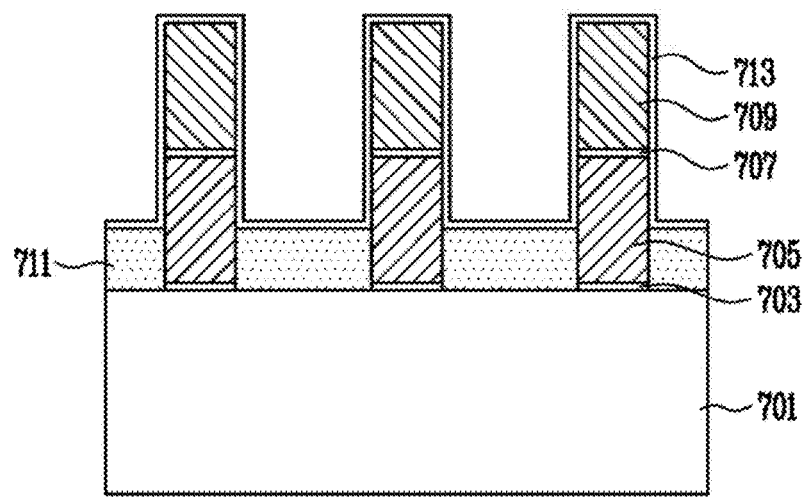
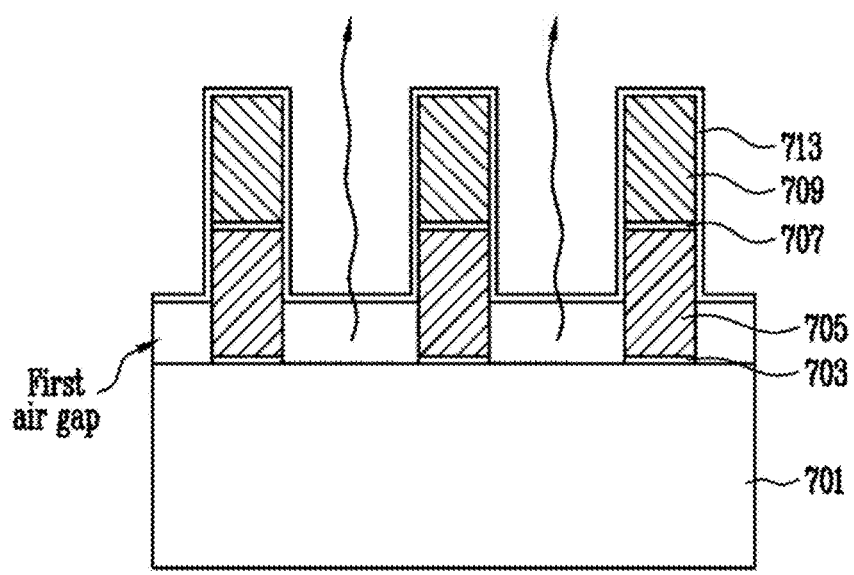

SEMICONDUCTOR MEMORY DEVICE AND MANUFACTURING METHOD THEREOF

CROSS-REFERENCE TO RELATED APPLICATION

This application is a division of U.S. patent application Ser. No. 13/715,504 filed on Dec. 14, 2012, which is based on and claims priority from Korean Patent Application No. 10-2012-0086915, filed on Aug. 8, 2012, with the Korean Intellectual Property Office. The disclosure of each of the foregoing applications is incorporated herein in its entirety by reference.

BACKGROUND

1. Field

The present invention relates to a semiconductor memory device and a method of manufacturing the same, and more particularly, to a semiconductor memory device including an air gap and a method of manufacturing the semiconductor memory device.

2. Discussion of Related Art

A semiconductor memory device includes a plurality of memory cells for storing data and devices for various operations. High-density integration of the semiconductor memory device has been demanded for large capacity and light weight. Especially, areas of the memory cells occupied in a semiconductor chip is very wide, so that a decrease in sizes of and intervals between the memory cells has continuously become an issue.

In a NAND flash memory device, the memory cells are arranged in the unit of a string, a space between the strings, i.e. an isolation region, is filled with a device separation film formed of an insulating material. The device separation film serves to block an electrical influence i.e. interference, between adjacent strings.

However, as the integration of the semiconductor memory devices is increased, there is a limit in blocking the interference between the strings by the device separation film formed of the insulating material, so that reliability of the semiconductor memory device may deteriorate.

SUMMARY

The present invention has been made in an effort to provide a semiconductor memory device capable of suppressing interference between the semiconductor memory devices and a method of manufacturing the semiconductor memory device. An exemplary semiconductor memory device, includes a semiconductor substrate in which isolation regions and active regions are defined, gate lines formed on the semiconductor substrate in a direction crossing the isolation regions, a capping layer configured to define air gaps positioned higher than an upper surface of the semiconductor substrate in the isolation regions. An exemplary semiconductor memory device includes a semiconductor substrate in which an isolation region and an active region are defined, a tunnel insulation layer, a floating gate, a capping layer, a dielectric layer, and a control gate formed over the semiconductor substrate of the active region, a trench formed in the semiconductor substrate of the isolation region, and an air gap formed inside the trench, where the capping layer defines an upper surface of the air gap and where the capping layer is positioned higher than a surface of the semiconductor substrate.

A method of forming an exemplary semiconductor memory device includes forming a tunnel insulation layer and a floating gate on a semiconductor substrate of an active region, forming a trench in the semiconductor substrate of an isolation region, forming, in the trench, a sacrificial layer having an upper surface positioned higher than a surface of the semiconductor substrate, forming a capping layer over the sacrificial layer, and forming an air gap by removing the sacrificial layer without removing the capping layer.

An exemplary semiconductor memory device includes a plurality of gate lines formed on a semiconductor substrate, and a plurality of capping layers formed between the gate lines, wherein the capping layers define a plurality of air gaps between the gate lines.

A method of forming an exemplary semiconductor memory device includes forming a plurality of gate lines on a semiconductor substrate; alternately forming sacrificial layers and capping layers on the semiconductor substrate between the gate lines and forming a plurality of air gaps, defined by the capping layers, between the gate lines by removing the sacrificial layers.

According to the embodiment of the present invention, the air gap is formed between the semiconductor memory devices, thereby suppressing interference between the semiconductor memory devices.

Further, in the method of forming the air gap, it is possible to form the air gap with a desired size at a desired position by using the sacrificial layer and the capping layer. Accordingly, a position at which interference is minimized is found through a simulation and the air gap is formed at a corresponding position, thereby improving reliability of the semiconductor memory device.

Further, it is possible to form the plurality of air gaps by forming the plurality of capping layers between the gate lines. Accordingly, it is simultaneously possible to minimize interference between the gate lines by the plurality of air gaps and to prevent the gate lines from leaning by the plurality of capping layers.

The foregoing summary is illustrative only and is not intended to be in any way limiting. In addition to the illustrative aspects and features described above, further aspects and features will become apparent by reference to the drawings and the following detailed description.

BRIEF DESCRIPTION OF THE DRAWINGS

The above and other features and advantages of the present invention will become more apparent to those of ordinary skill in the art by describing in detail embodiments thereof with reference to the attached drawings in which:

FIGS. 1A to 1H are cross-sectional views illustrating a method of manufacturing an exemplary semiconductor memory device;

FIGS. 7A to 7I are cross sectional views illustrating a method of manufacturing an exemplary semiconductor memory device.

DETAILED DESCRIPTION

Hereinafter, an embodiment of the present invention will be described with reference to the accompanying drawings in detail. However, the present invention is not limited to an embodiment disclosed below and may be implemented in various forms and the scope of the present invention is not limited to the following embodiments. Rather, the embodiment is provided to more sincerely and fully disclose the present invention and to completely transfer the spirit of the present invention to those skilled in the art to which the present invention pertains, and the scope of the present invention should be understood by the claims of the present invention.

FIGS. 1A to 1H are cross-sectional views illustrating an exemplary method of manufacturing a semiconductor memory device.

Figure 1A:
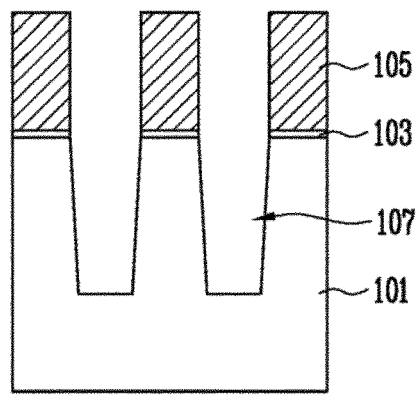

Referring to FIG. 1A, a tunnel insulation layer 103 and a first conductive layer 105 for a floating gate are sequentially formed on a semiconductor substrate 101, in which an active region and an isolation region are defined. The tunnel insulation layer 103 may be formed of an oxide layer, and the first conductive layer 105 may be formed of a polysilicon layer. For example, the first conductive layer 105 may be formed of a doped polysilicon layer, in which an impurity has been injected, or may be formed by stacking undoped polysilicon layers, in which an impurity has not been injected.

A trench 107 is formed by etching the first conductive layer 105, the tunnel insulation layer 103, and the semiconductor substrate 101 of the isolation region. For example, although it is not illustrated in the drawing, the trench 107 may be formed by forming a mask pattern (not shown) in which the isolation region is opened on the first conductive layer 105 and sequentially etching the first conductive layer 105, the tunnel insulation layer 103, and the semiconductor substrate 101 exposed through the mask pattern (not shown). The mask pattern (not shown) may be removed after forming the trench 107.

Figure 1B:
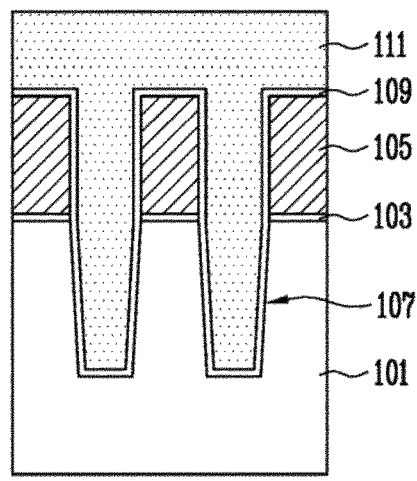

Referring to FIG. 1B, a liner insulation layer 109 is formed over a top surface of surface of the first conductive layer 105, as well as over a surface of the first conductive layer 105 and a surface of the semiconductor substrate 101 that defines the trench 107. The liner insulation layer 109 minimizes damage to surfaces of the trench 107 during an etching process for forming the trench 107. Next, a sacrificial layer 111 is formed on the liner insulation layer 109. The sacrificial layer 111, which will be removed in a subsequent process to forming an air gap, is formed of a flowable material. For example, a carbon-based material (containing about 60% of carbon) may be used for the sacrificial layer 111. The carbon-based material may easily be removed by plasma. For example, the carbon-based material for the sacrificial layer 111 may be a Spin-On-Carbon (SOC) layer, a photoresist (PR) layer, or carbon layer for a hard mask. The sacrificial layer 111 having a flowable property may be formed by a spin coating method. Next, a solidification process for transforming the flowable sacrificial layer into a solid is performed. The solidification process may be performed by a heat treatment process.

Figure 1C:
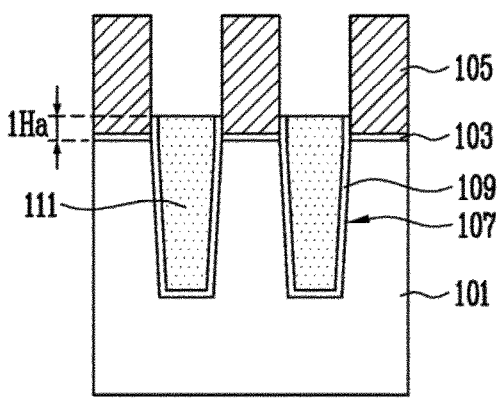

Referring to FIG. 1C, the first conductive layer 105 is exposed through the etching process. Specifically, the first conductive layer 105 is exposed by etching the sacrificial layer 111 and the liner insulation layer 109 using an etchback process. When the first conductive layer 105 is exposed, an additional etching process is performed so that a surface of the sacrificial layer 111 becomes lower than that of the first conductive layer 105. Here, it is very important to adjust a height difference 1Ha between a surface of the remaining sacrificial layer 111 and an upper surface of the semiconductor substrate 101, because the surface of the remaining sacrificial layer 111 becomes a surface defining an upper portion of the air gap (which will be subsequently formed). Interference between adjacent memory cells and strings is differentiated according to a difference of the height of the remaining sacrificial layer 111 (which defines the air gap) and the height of the semiconductor substrate 101. Testing indicates that for an exemplary semiconductor memory device, the height difference 1Ha should be about 50 Å to about 150 Å. However, the height difference 1Ha may be appropriately changed according to the specific semiconductor memory device.

Referring to FIG. 1D, after the height of the sacrificial layer 111 is adjusted, a capping layer 113 is formed over the remaining sacrificial layer 111 and the first conductive layer 105. The capping layer 113 is formed of a non-porous material, such as silicon dioxide ($SiO_2$), silicon nitride (SiN), silicon oxynitride (SiON), or silicon carbon nitride (SiCN). The capping layer 113 may be formed by an atomic-layer deposition (ALD) method at a low temperature (about 50° C. to about 100° C.) to prevent the sacrificial layer 111 from being damaged or removed. For example, since the carbon-based sacrificial layer 111 may be damaged at a temperature of about 300° C. to about 400° C., the capping layer 113 must be formed at a temperature lower than about 300° C.

When the capping layer 113 is formed by the ALD method, step coverage may be improved and it is easy to form the capping layer 113 with a uniform thickness. A thickness of the capping layer 113 may be adjusted based on the specific memory device. In order to easily remove the sacrificial layer 111 (during a subsequent removal process), the capping layer 113 may have a thickness of about 5 Å to about 50 Å.

Referring to FIG. 1E, the sacrificial layer 111 (reference number 111 of FIG. 1D) under the capping layer 113 is removed by using plasma. Specifically, plasma is generated inside a chamber in which the semiconductor substrate 101 is loaded. For example, oxygen, nitrogen, or hydrogen plasma may be generated. Here, a case in which oxygen plasma is generated will be described as an example.

Figure 3:
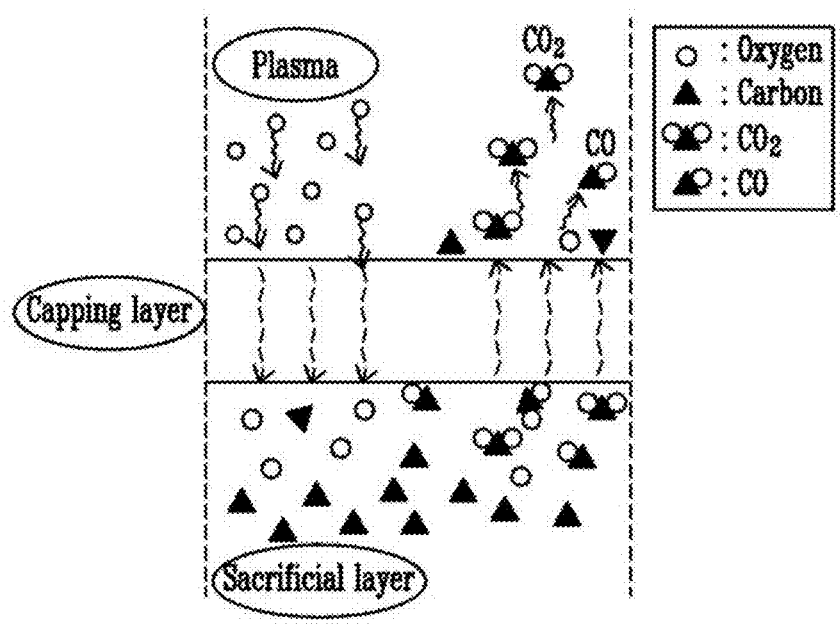
FIG. 3 is a diagram illustrating a principle of removing an exemplary sacrificial layer.

FIG. 3 is a diagram illustrating a principle of removing the sacrificial layer in the present invention.

Referring to FIG. 3, when oxygen plasma is generated, oxygen radicals are generated and the oxygen radicals pass through the capping layer 113 to reach the sacrificial layer under the capping layer 113. Then, the oxygen radicals and the carbon within the sacrificial layer react each other so that the sacrificial layer 111 is changed into $CO_2$ or Co radical, and the $CO_2$ or Co radical passes through the capping layer 111 to be discharged to the outside. Through the aforementioned process, the sacrificial layer 111 under the capping layer 113 may be removed, and a space in which the sacrificial layer 111 is removed becomes the air gap. Since the air gap has the same height as that of the sacrificial layer, it is possible to freely adjust the height difference 1Ha between the upper portion of the air gap and the upper portion of the semiconductor substrate 101 by adjusting the height of the sacrificial' layer in FIG. 1C.

Referring to FIG. 1F, because the thickness of the capping layer 113 on the upper portion of the air gap is thin, a first insulation layer 115 is formed on the capping layer 113 in order to supplement the thickness of the capping layer 113. The first insulation layer 115 is formed of an oxide layer, and is formed, for example, of a flowable material, such as polysilazane (PSZ). The PSZ layer is a flowable material so that a void is not generated between the first conductive layers 105. After the PSZ layer is formed, the PSZ layer is solidified by performing a heat treatment process.

Figure 1G:
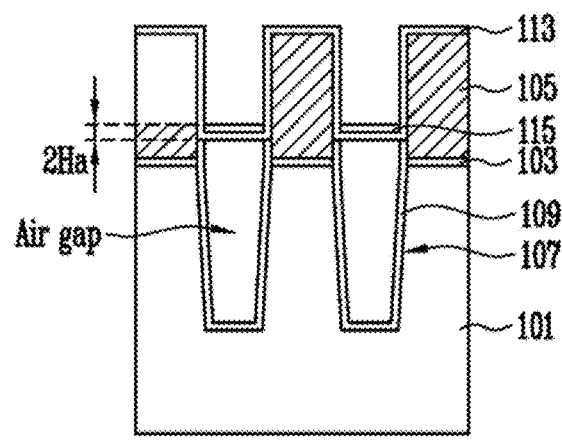

Referring to FIG. 1G, the first insulation layer 115 is etched so that a portion of the first insulation layer 115 is remains on the capping layer 113 in the isolation region. A process of etching the first insulation layer 115 is performed so that a thickness 2Ha of the first insulation layer 115 left in the isolation region and the capping layer 113 is enough to support the upper portion of the air gap.

Figure 1H:
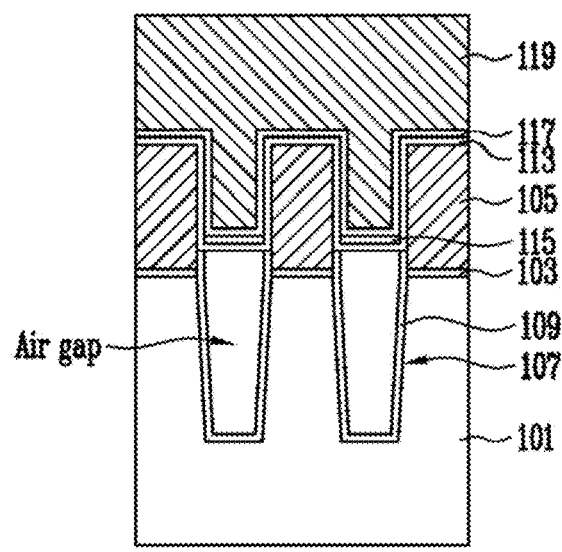

Referring to FIG. 1H, a dielectric layer 117 is formed over the capping layer and the portion of the first insulation layer 115. Then a second conductive layer 119 for a control gate is formed on the dielectric layer 117. For example, the dielectric layer 117 may be formed by sequentially stacking an oxide layer, a nitride layer, and an oxide layer. Alternatively, the dielectric layer 117 may be formed in a single layer made of a high dielectric material. The second conductive layer 119 is formed as a polysilicon layer, for example, a doped polysilicon layer.

Next, gate lines are arranged in a direction crossing the isolation region by performing a patterning process. That is, each of the gate lines may include the tunnel insulation layer 103, the first conductive layer 105, the capping layer 113, the dielectric layer 117, and the second conductive layer 119 stacked on the semiconductor substrate.

FIGS. 2A to K are cross-sectional views illustrating a method of manufacturing an exemplary semiconductor memory device.

Figure 2A:
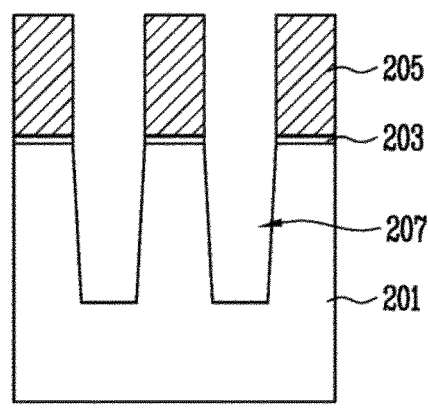
FIGS. 2A to 2K are cross-sectional views illustrating a method of manufacturing an exemplary semiconductor memory.

Referring to FIG. 2A, a tunnel insulation layer 203 and a first conductive layer 205 for a floating gate are sequentially formed on a semiconductor substrate 201, in which an active region and an isolation region are defined. The tunnel insulation layer 203 may be formed of an oxide layer, and the first conductive layer 205 may be formed of a polysilicon layer. For example, the first conductive layer 205 may be formed of a doped polysilicon layer in which an impurity has been injected. Alternatively, the first conductive layer 205 may be formed by stacking undoped polysilicon layers, in which impurity has not been injected.

A trench 207 is formed by etching the first conductive layer 205, the tunnel insulation layer 203, and the semiconductor substrate 201 of the isolation region. For example, although it is not illustrated in the drawing, the trench 207 may be formed by forming a mask pattern (not shown) in which the isolation region is opened on the first conductive layer 205 and sequentially etching the first conductive layer 205, the tunnel insulation layer 203, and the semiconductor substrate 201 exposed through the mask pattern (not shown). The mask pattern (not shown) may be removed after forming the trench 207.

Figure 2B:
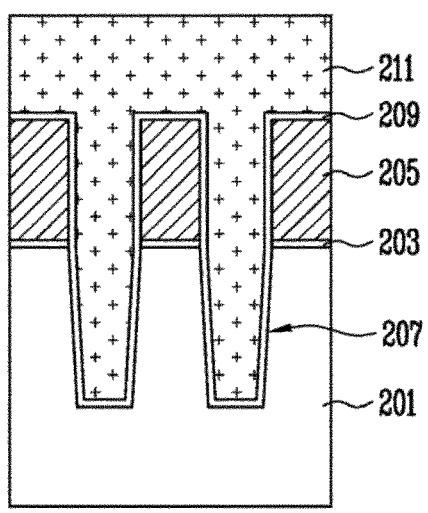

Referring to FIG. 2B, a liner insulation layer 209 is formed over a top surface of surface of the first conductive layer 205, as well as over a surface the first conductive layer 205 and a surface of the semiconductor substrate 201 that defines the trench 207. The liner insulation layer 209 minimizes damage generated to the surfaces of the trench 207 during an etching process for forming the trench 207. Next, a lower insulation layer 211 is formed on the liner insulation layer 209. The lower insulation layer 211, which will be removed in a subsequent process to forming an air gap, is formed of a flowable material. The lower insulation layer 211 is formed of an oxide layer, such as a flowable PSZ layer, with which inside the trench 207 is filled. After the PSZ layer is formed, the PSZ layer is solidified by performing a heat treatment process.

Figure 2C:
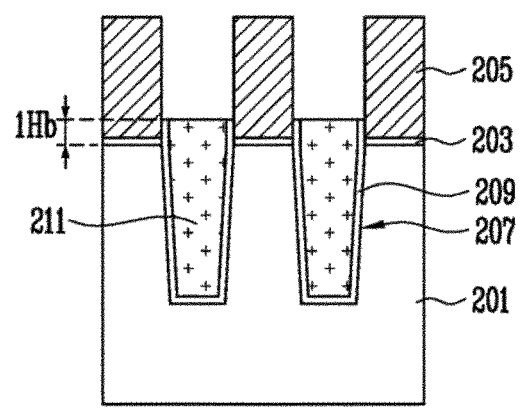

Referring to FIG. 2C, the first conductive layer 205 is exposed through an etching process. Specifically, the first conductive layer 205 is exposed by etching the lower insulation layer 211 and the liner insulation layer 209 using an etch-back process. When the first conductive layer 205 is exposed, an additional etching process is performed so that an upper surface of the lower insulation layer 211 becomes lower than that of the first conductive layer 205. The etching process is performed with an etchant having an etching selectivity that is substantially the same for the lower insulation layer 211 and the liner insulation layer 209. Here, it is very important to adjust a height difference 1Hb between the upper surface of the remaining lower insulation layer 211 and a surface of the semiconductor substrate 201, because the upper surface of the remaining lower insulation layer 211 become defines an upper portion of the air gap (which will be subsequently formed). Interference between adjacent memory cells and strings is differentiated according to a difference of the height of the remaining sacrificial layer 211 (which defines the air gap) and the height of the semiconductor substrate 201. Testing indicates that for an exemplary semiconductor memory device, the height difference 1Hb should be about 50 Å to about 150 Å. However, the height difference 1Hb may be appropriately changed according to the specific semiconductor memory device.

Figure 2D:
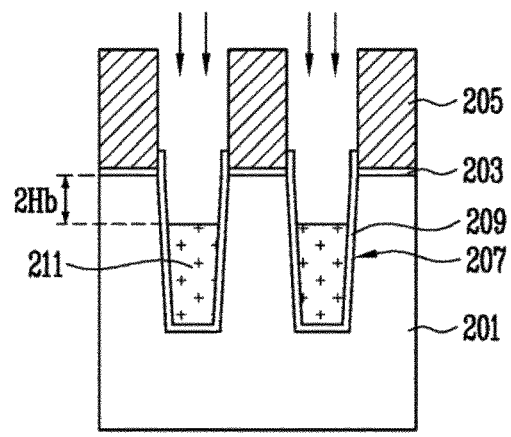

Referring to FIG. 2D, the lower insulation layer 211 is partially etched in order to adjust a height of a surface of the lower insulation layer 211 that will define a lower portion of the air gap (which will be subsequently formed). That is, the etching process is performed so as to adjust a height difference 2Hb between the upper surface of the semiconductor substrate 201 and the upper surface of the remaining lower insulation layer 211. Testing indicates that for an exemplary semiconductor memory device, the height difference 2Hb should be about 100 Å to about 400 Å. However, the height difference 2Hb may be appropriately changed according to the specific semiconductor memory device.

In this case, the etching process is performed with an etchant having a greater etching selectivity for the lower insulation layer 211 than for the liner insulation layer 209. That is, an etching speed of the lower insulation layer 211 is faster than an etching speed of the liner insulation layer.

Figure 2E:
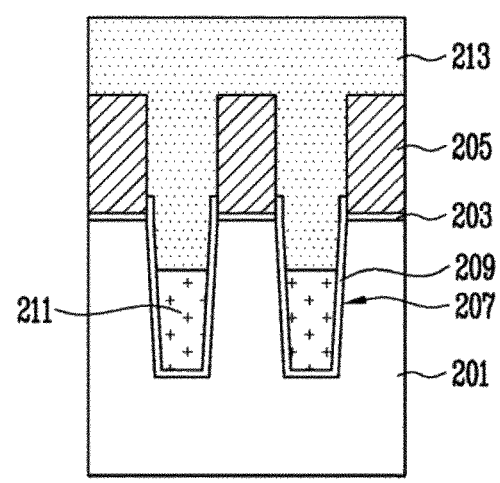

Referring to FIG. 2E, a sacrificial layer 213 is formed on the first conductive layer 205, the lower insulation layer 211, and the liner insulation layer 209. The sacrificial layer 213 (which will be removed in a subsequent process to form the air gap) a flowable material. For example, a carbon-based material (containing about 60% carbon) may be used for the sacrificial layer 213. The carbon-based material may easily be removed by plasma. For example, the carbon-based material for the sacrificial layer 213 may be a Spin-On-Carbon (SOC) layer, a photoresist (PR) layer, or a carbon layer for a hard mask. The sacrificial layer 213 having a flowable property may be formed by a spin coating method. Next, a solidification process for transforming the flowable sacrificial layer 213 into a solid is performed after forming the sacrificial layer 213. The solidification process may be performed by a heat treatment process.

Figure 2F:
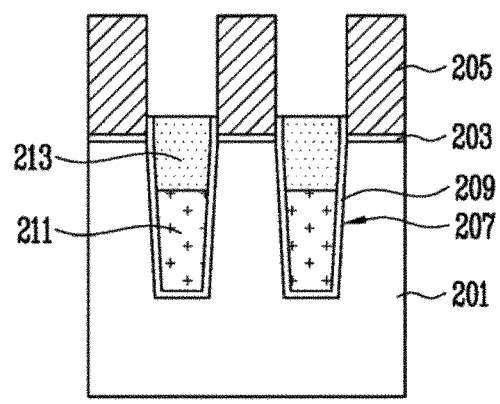

Referring to FIG. 2F, the first conductive layer 205 is exposed by performing an etching process. When the first conductive layer 205 is exposed, an additional etching process is performed so that an upper surface of the sacrificial layer 213 becomes lower than a surface of the first conductive layer 205. In this case, the height of the upper surface of the sacrificial layer 213 may be adjusted so as to be the same as that of the upper surface of the liner insulation layer 209, or the height difference between the semiconductor substrate 201 and the upper portion of the sacrificial layer 213 may be adjusted to be the aforementioned height 1Hb.

Figure 2G:
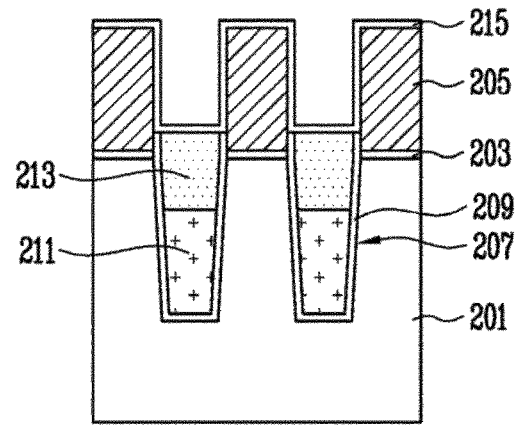

Referring to FIG. 2G, after the height of the sacrificial layer 213 is adjusted, a capping layer 215 is formed over the remaining sacrificial layer 213 and the first conductive layer 205. The capping layer 215 is formed of a non-porous material, such as $SiO_2$, SiN, SiON, or SiCN. The capping layer 215 may be formed by an atomic-layer deposition (ALD) method at a low temperature (about 50° C. to about 100° C.) to prevent the sacrificial layer 213 from being damaged or removed. When the capping layer 215 is formed by the ALD method, step coverage may be improved and it is easy to form the capping layer 215 with a uniform thickness. A thickness of the capping layer 215 may be adjusted based on the specific memory device. In order to easily remove the sacrificial layer 213 (during a subsequent removal process) the capping layer 215 may have a thickness of about 5 Å to about 50 Å.

Figure 2H:
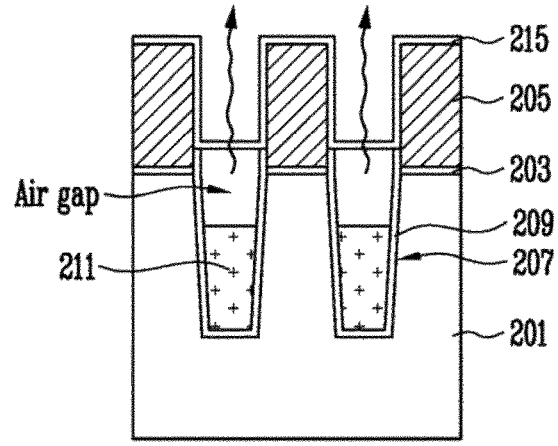

Referring to FIG. 2H, the sacrificial layer 213 (reference number 213 of FIG. 2G) under the capping layer 215 is removed by using plasma. Specifically, plasma is generated inside a chamber in which the semiconductor substrate 201 is loaded. For example, oxygen, nitrogen, or hydrogen plasma may be generated. Here, a case in which oxygen plasma is generated will be described as an example.

FIG. 3 is a diagram illustrating a principle of removing the sacrificial layer in the present invention.

Referring to FIG. 3, when oxygen plasma is generated, oxygen radicals are generated and the oxygen radicals pass through the capping layer 215 to reach the sacrificial layer 213 under the capping layer 215. Then, the oxygen radicals and the carbon within the sacrificial layer 213 react each other so that the sacrificial layer 213 is changed into $CO_2$ or Co radical, and the $CO_2$ or Co radical passes through the capping layer 215 again to be discharged to the outside. Through the aforementioned process, the sacrificial layer 213 under the capping layer 215 may be removed, and a space in which the sacrificial layer 213 is removed becomes the air gap. Since the air gap has the same height as that of the sacrificial layer 213, it is possible to freely adjust the height between the upper portion of the air gap and the upper portion of the semiconductor substrate 201 by adjusting the height of the sacrificial layer 213 in FIG. 2F.

Figure 2I:
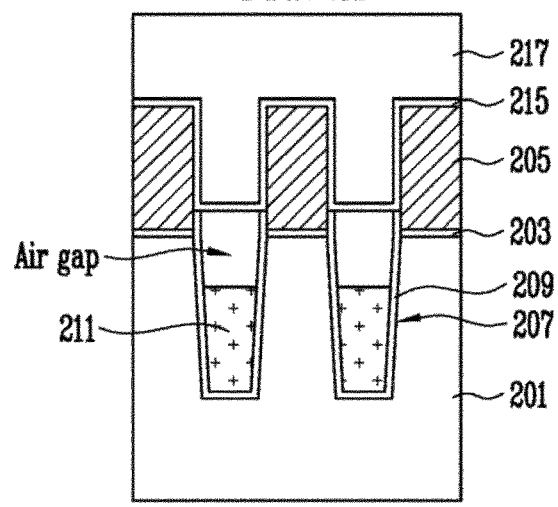

Referring to FIG. 2I, because the thickness of the capping layer 215 on the upper portion of the air gap is thin, a first insulation layer 217 is formed on the capping layer 215 in order to supplement the thickness of the capping layer 215. The first insulation layer 217 is formed of an oxide layer, and is formed, for example, of a flowable PSZ layer. After the PSZ layer is formed, the PSZ layer is solidified by performing a heat treatment process.

Figure 2J:
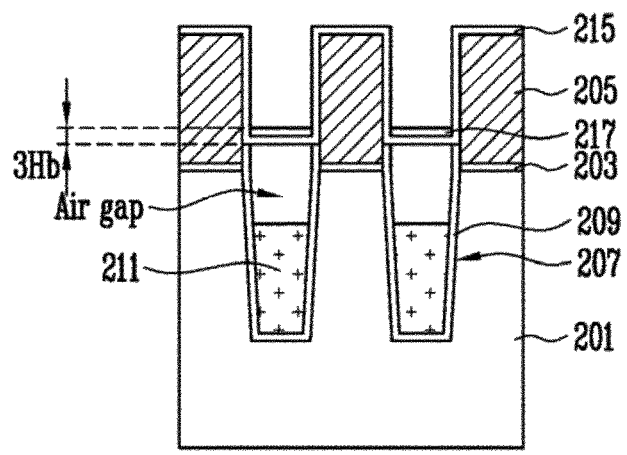

Referring to FIG. 2J, the first insulation layer 217 is etched so that a portion of the first insulation layer 217 remains on the capping layer 215 in the isolation region. A process of etching the first insulation layer 217 is performed so that a thickness 3Hb of the first insulation layer 217 left in the isolation region and the capping layer 215 is enough to support the upper portion of the air gap.

Figure 2K:
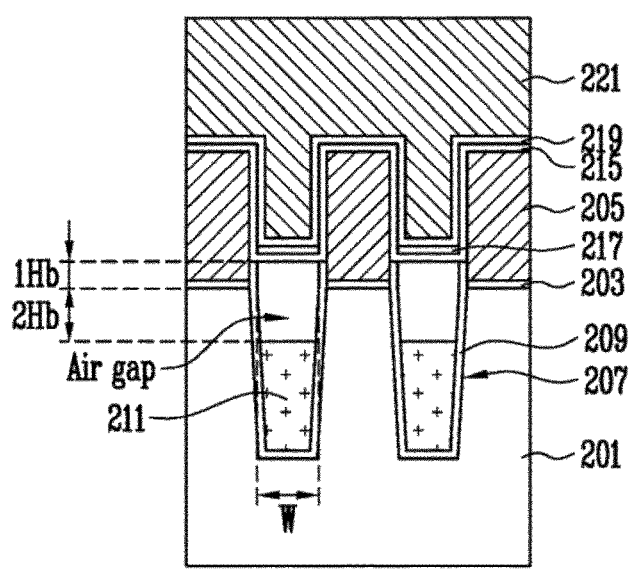

Referring to FIG. 2K, a dielectric layer 219 is formed over the capping layer 215 and the portion of the first insulation layer 217. Then a second conductive layer 221 for a control gate is formed on the dielectric layer 219. For example, the dielectric layer 219 may be formed by sequentially stacking an oxide layer, a nitride layer, and an oxide layer. Alternatively, the dielectric layer 219 may be formed in a single layer made of a high dielectric material. The second conductive layer 221 is formed as a polysilicon layer, for example, a doped polysilicon layer.

Next, gate lines are arranged in a direction crossing the isolation region are formed by performing a patterning process. That is, each of the gate lines may include the tunnel insulation layer 203, the first conductive layer 205, the capping layer 215, the dielectric layer 219, and the second conductive layer 221 stacked on the semiconductor substrate.

Figure 4:
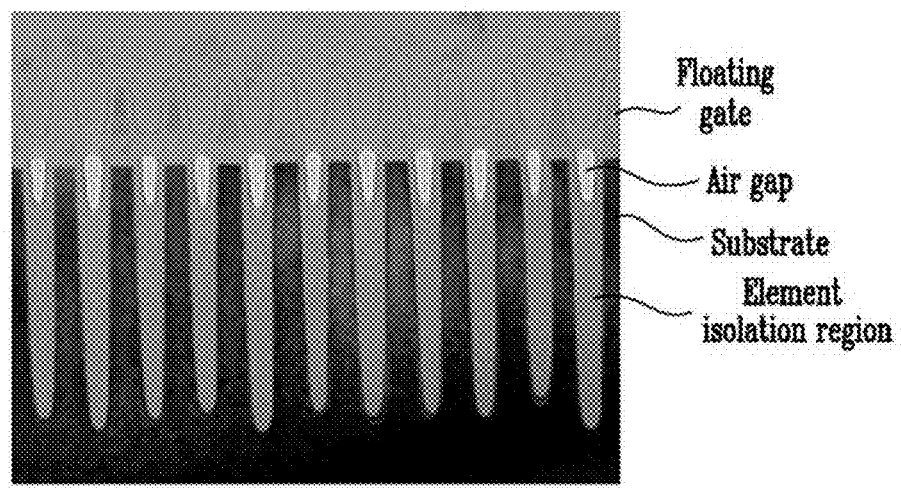
FIG. 4 is an image a section of an exemplary semiconductor memory device including air gaps.

FIG. 4 is picture of a section of a semiconductor memory device including air gaps according to the present invention.

Referring to FIG. 4, the air gap is formed inside the isolation region and the height of the air gap is higher than the semiconductor substrate. Thus, it is possible to suppress interference between the memory cells, especially, the floating gates, and interference between channel regions of the strings.

As described above, a difference of interference is generated according to a position and a structure of the air gap, and a test result of the interference difference will be described below.

Figure 5A:
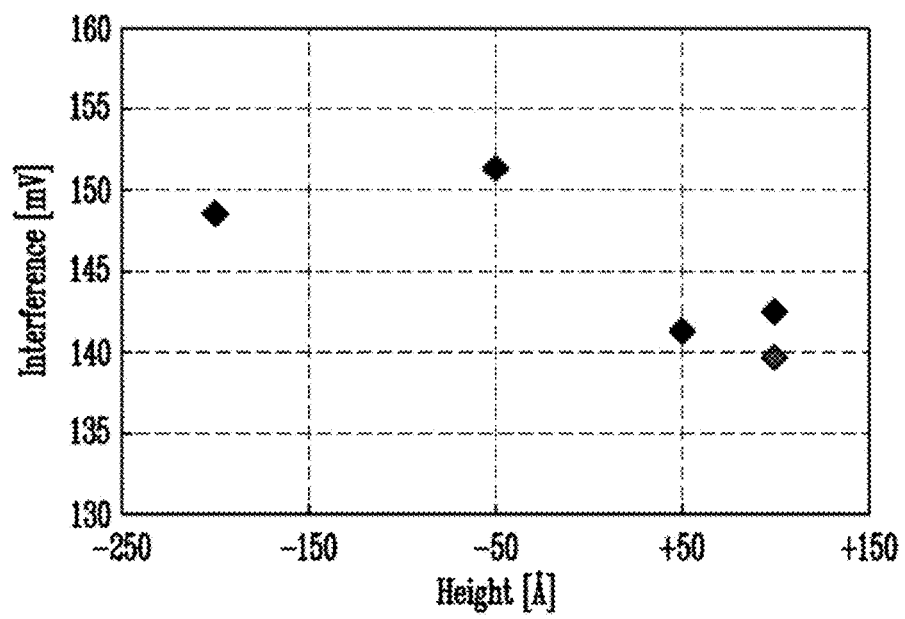
FIG. 5A is a graph illustrating interference between adjacent cells according to a height of a surface defining an upper portion of an air gap.
Figure 5B:
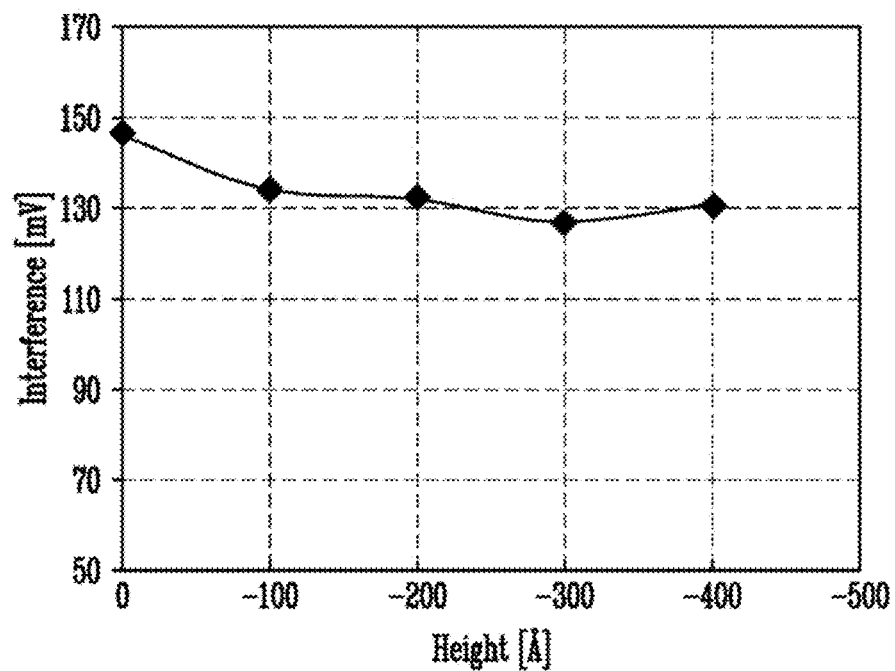
FIG. 5B is a graph illustrating interference between adjacent cells according to a height of a surface defining lower portion of an air gap.
Figure 5C:
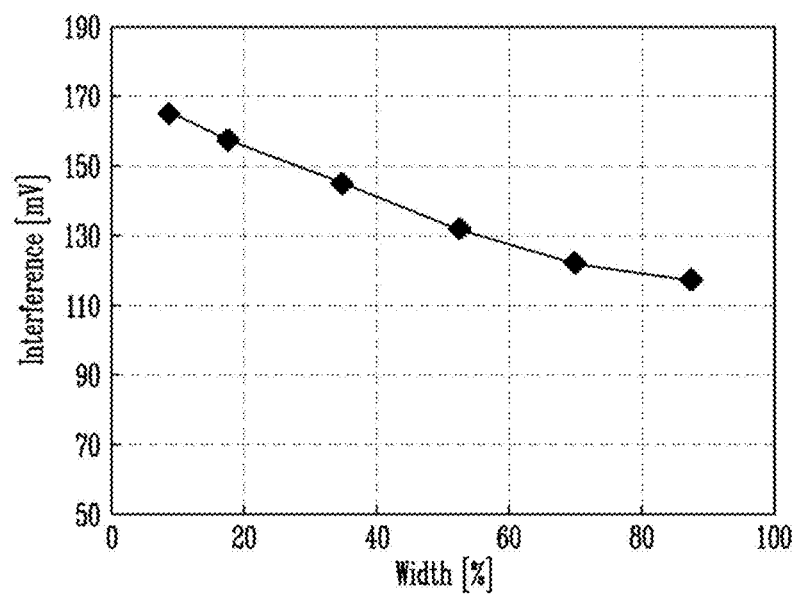
FIG. 5C is a graph illustrating interference between adjacent cells according to a width of an air gap.

FIG. 5A is a graph illustrating interference between adjacent cells according to a height of the surface defining the upper portion of the air gap. FIG. 5B is a graph illustrating interference between adjacent cells according to a height of a surface defining the lower portion of the air gap. FIG. 5C is a graph illustrating interference between adjacent cells according to a width of the air gap.

Referring to FIG. 5A, an X-axis (height) of the graph represents a height difference between the surface defining the upper portion of the air gap and the upper surface of the semiconductor substrate and a Y-axis represents interference. In the graph, it can be seen that a decrease in interference is not remarkable when the height of the surface defining the upper portion of the air gap is lower than the upper surface of the semiconductor substrate (a minus section in the X-axis), but the interference is considerably decreased from a section in which the surface defining the upper portion of the air gap is higher than the upper surface of the semiconductor substrate (a plus section in the X-axis). In the graph, it can be seen that the interference is considerably decreased when the surface defining the upper portion of the air gap is higher than the upper surface of the semiconductor substrate by about 50 Å to about 150 Å.

Referring to FIG. 5B, an X-axis (height) of the graph represents a height difference between the surface defining the lower portion of the air gap and the upper surface of the semiconductor substrate and a Y-axis represents interference. For example, "−200 Å" in the X-axis means that the surface defining the lower portion of the air gap is lower than the upper portion of the semiconductor substrate by 200 Å.

As can be seen from the graph of FIG. 5B, the interference is decreased as the surface defining the lower portion of the air gap becomes lower than the upper surface of the semiconductor substrate. However, a quantity of an interference change is about 150 my to 130 mV. Thus, a height difference between the surface defining the lower portion of the air gap and the upper surface of the semiconductor substrate less exerts influence on the interference than a height difference between the surface defining the upper surface of the air gap and the upper surface of the semiconductor substrate.

Referring to FIG. 5C, an X-axis (width) of the graph represents a ratio (%) of a width of the air gap to a width (trench) of the isolation region and a Y-axis represents interference. In the graph, it can be seen that as the width of the air gap increases, that is, as the width of the air gap becomes close to the width of the trench, the interference is decreased.

As shown in FIGS. 5A to 5C, the height and the width of the surface defining the upper portion of the air gap exert a large influence on the interference between the memory cells, as compared to the height of the surface defining the lower portion of the air gap. For example, the interference between the memory cells may be minimized when the surface defining the upper portion of the air gap is higher than the upper surface of the semiconductor substrate by about 50 Å to about 100 Å, and the width of the air gap is close to the width of the trench. However, this value is an example obtained as the result of the test. A position and a width at which the interference is minimized may be adjusted by appropriately adjusting the position and the width according to the requirements of a specific memory device. The height of the sacrificial layer (which defines the upper portion of the air gap) may be adjusted via the processes of the manufacturing the semiconductor memory device. (See e.g., FIGS. 1C and 2F). The width of the sacrificial layer may be adjusted (see FIGS. 1E and 2H) via the processes of the manufacturing the semiconductor memory device, so that the width of the air gap is close to the width of the trench.

Figure 6A:
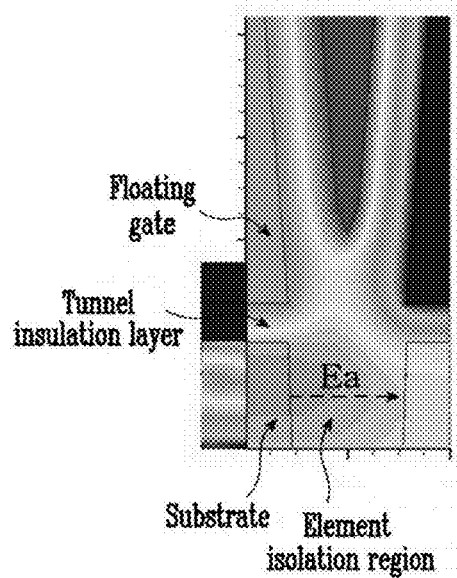
FIGS. 6A to 6C are simulation diagrams illustrating interference according to a height of a surface defining an upper portion of an air gap.
Figure 6B:
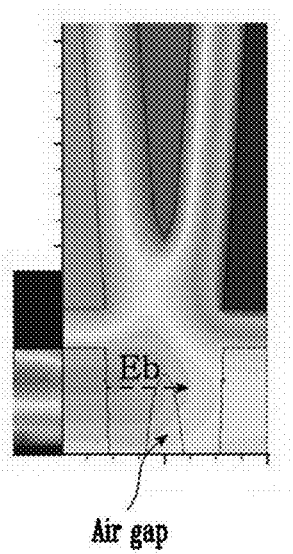
Figure 6C:
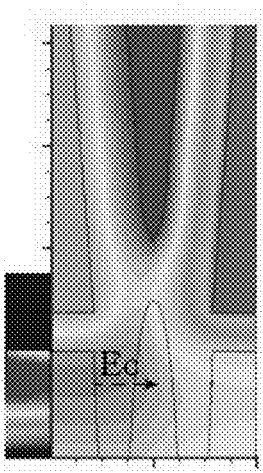

FIGS. 6A to 6C are simulation diagrams illustrating interference according to a height of the surface defining the upper portion of the air gap.

FIG. 6A shows interference in a memory device having no air gap. FIG. 6B shows interference in a memory device, where a surface defining an upper portion of an air gap is lower than an upper surface of a semiconductor substrate. FIG. 6C shows interference in an exemplary memory device, where a surface defining an upper portion is higher an upper surface of the semiconductor substrate.

In FIGS. 6A to 6C, darker shading means that a region has more interference than a region with lighter shading. Accordingly, in FIG. 6A, the region affected by interference Ea is wider than the cases shown in FIG. 6B or 6C that of case B or case C, so it can be seen that interference to an adjacent cell is high. In FIG. 6B, it can be seen that interference Eb is decreased compared to the case in which the memory device has no air gap, shown in FIG. 6A. In FIG. 6C, it can be seen that interference Ec is decreased compared to FIG. 6B, in which the upper surface of the air gap is lower than the upper surface of the semiconductor substrate.

As described, it is possible to decrease interference between active regions by forming the air gap. Especially, when the air gap is formed within the isolation region, the interference may be effectively decreased as the upper surface of the air gap is higher than the semiconductor substrate in the active region and the width of the air gap is close to the width of the isolation region.

FIGS. 7A to 7I are cross sectional views illustrating a method of manufacturing an exemplary semiconductor memory device.

Figure 7A:
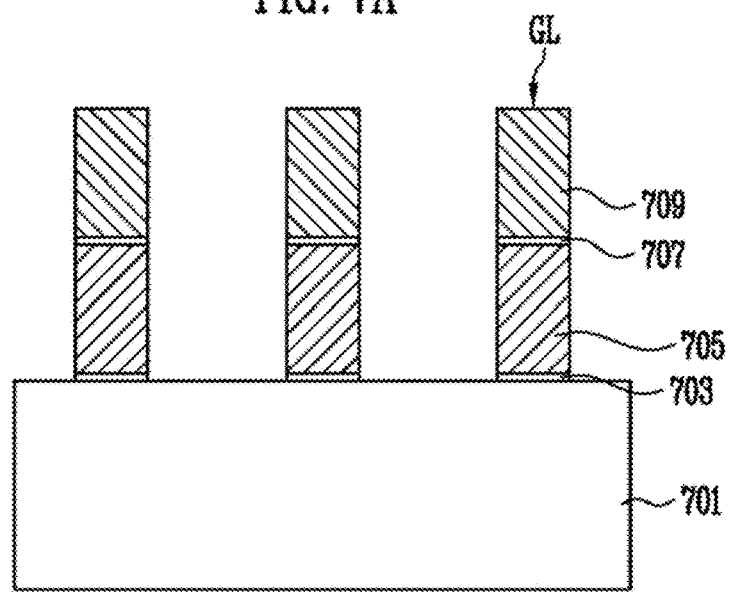

Referring to FIG. 7A, a plurality of gate lines GL is formed on a semiconductor substrate 701. For example, each of the plurality of gate lines GL may be formed in a structure in which a tunnel insulation layer 703, a floating gate 705, a dielectric layer 707, and a control gate 709 are stacked. A structure of the plurality of gate lines GL illustrated in the drawing may be variously changed according to specific requirements of a semiconductor memory device.

Figure 7B:
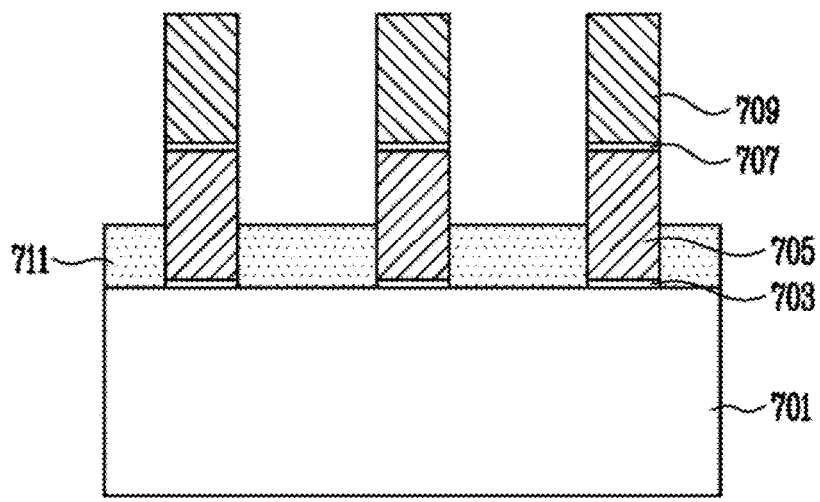

Referring to FIG. 7B, a first sacrificial layer 711, having a first thickness, is formed on the semiconductor substrate 701 between each of the plurality of gate lines GL. Specifically, the first sacrificial layer 711 is formed on an entire structure including the gate lines GL, and the first sacrificial layer 711 is formed so as to cover all of upper portions of the gate lines GL so that spaces between the gate lines GL are sufficiently filled with the first sacrificial layer 711. A flowable carbon-based material (containing about 60% of carbon) is used as the sacrificial layer 711. The carbon-based material may easily be removed by plasma. For example, the sacrificial layer 711 may be a Spin-On-Carbon (SOC) layer or a photoresist (PR) layer. The sacrificial layer 711 may be formed by a spin coating method. Next, a solidification process for transforming the flowable first sacrificial layer 711 into a solid is performed after forming the first sacrificial layer 711. The solidification process may be performed by a heat treatment process. Next, the first sacrificial layer 711 is etched to the first thickness (which defines an upper portion of an air gap that will be subsequently formed).

Referring to FIG. 7C, a first capping layer 713 is formed on a surface of the floating gate 705, the dielectric layer 707, the control gate 709, and the first sacrificial layer 711. The first capping layer 713 is formed of a non-porous material, such as $SiO_2$, SiN, SiON, or SiCN. Especially, in the process of forming the first capping layer 713, the first capping layer 713 is formed by an ALD method at a low temperature (about 50° C. to about 100° C.) so as to prevent the first sacrificial layer 711 from being damaged or partially removed. When the first capping layer 713 is formed by the ALD method, step coverage may be improved and it is easy to form the first capping layer 713 with a uniform thickness. A thickness of the first capping layer 713 may be adjusted according to the requirements of a specific memory device. In order to easily remove the first sacrificial layer 711 in a subsequent process, the first capping layer 713 may have a thickness of about 5 Å to about 50 Å.

Referring to FIG. 7D, the first sacrificial layer (reference number 711 of FIG. 7C) under the first capping layer 713 is removed by using plasma. Specifically, plasma is generated inside a chamber in which the semiconductor substrate 701 is loaded. For example, oxygen, nitrogen, or hydrogen plasma may be generated. When the plasma is generated, the first sacrificial layer 711 passes through the first capping layer 713 to exit to the outside, as described above with reference to FIG. 3. A space from which the first sacrificial layer 711 is removed becomes a first air gap.

Figure 7E:
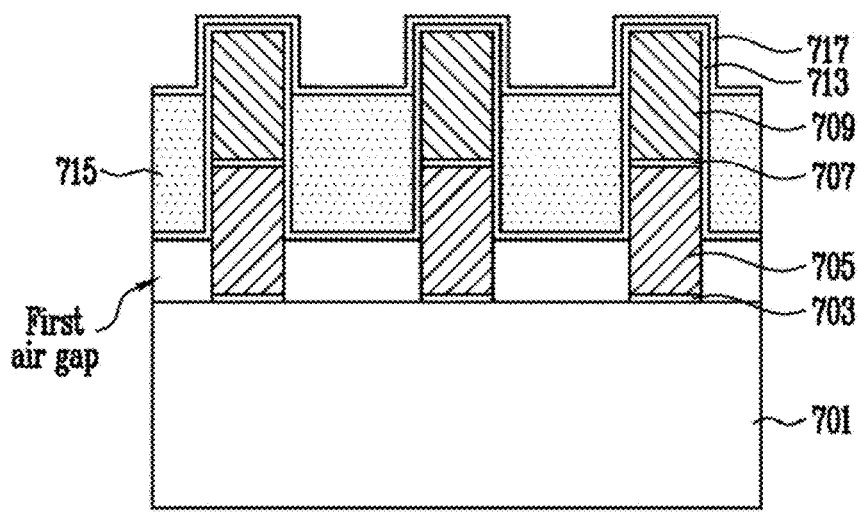

Referring to FIG. 7E, a second sacrificial layer 715, having a second thickness, is formed on a portion of the first capping layer 713 that covers the first air gap. The second sacrificial layer 715 may be formed of the same material, and by the same method, as was used to form the first sacrificial layer 711, described above with reference to FIG. 7B. Next, a second capping layer 717 is formed over a surface of the second sacrificial layer 715 and the first capping layer 713. The second capping layer 717 is formed of a non-porous material, such as $SiO_2$, SiN, SiON, or SiCN. The second capping layer 717 may be formed by an ALD method at a low temperature (about 50° C. to about 100° C.).

A thickness of the second capping layer 717 may be adjusted according to the requirements of a specific memory device. For example, the second capping layer 717 may have a thickness of about 5 Å to about 50 Å.

Figure 7F:
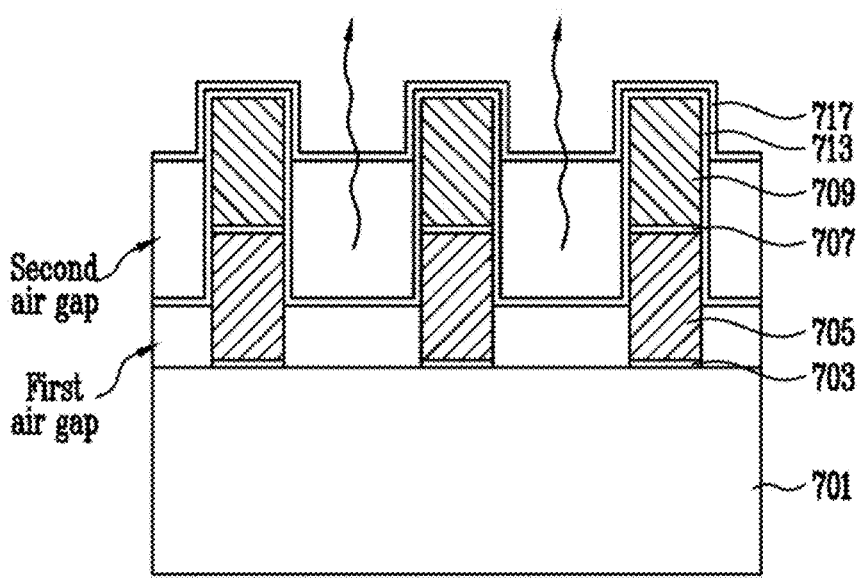

Referring to FIG. 7F, the second sacrificial layer (reference number 715 of FIG. 7E) under the second capping layer 717 is removed by using plasma. For example, plasma may be generated inside a chamber in which the semiconductor substrate 701 is loaded. For example, oxygen, nitrogen, or hydrogen plasma may be generated. When the plasma is generated, the second sacrificial layer 715 passes through the second capping layer 717 to exit to the outside, as described above with reference to FIG. 3. A space from which the second sacrificial layer 715 is removed becomes a second air gap. The second air gap is formed on the first capping layer 713 and has a width that is narrower than a width of the first air gap.

Figure 7G:
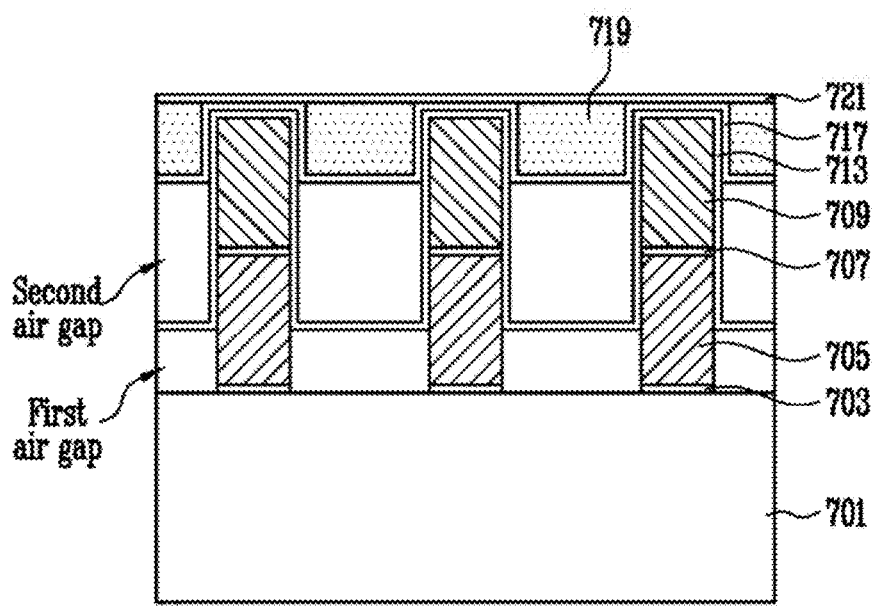

Referring to FIG. 7G, a third sacrificial layer 719, having a third thickness, is formed on a portion of the second capping layer 717 that covers the second air gap. The third sacrificial layer 719 may be formed of the same material as that of the first sacrificial layer 711 and the second sacrificial layer 715. The third sacrificial layer 719 is formed so that an upper surface of the third sacrificial layer 719 is substantially coplanar with an upper surface of the second capping layer 717 formed on the gate lines GL. The third sacrificial layer 719 may be formed of the same material, and by the same method, as was used to form the first sacrificial layer 711 or the second sacrificial layer 715. A third capping layer 721 is formed on the third sacrificial layer 719 and the second capping layer 717. The third capping layer 721 is formed of a non-porous material, such as SiO$_2$, SiN, SIGN, or SiCN. The third capping layer 721 may be formed using the same method as used to form the first capping layer 713 or the second capping layer 717.

Figure 7H:
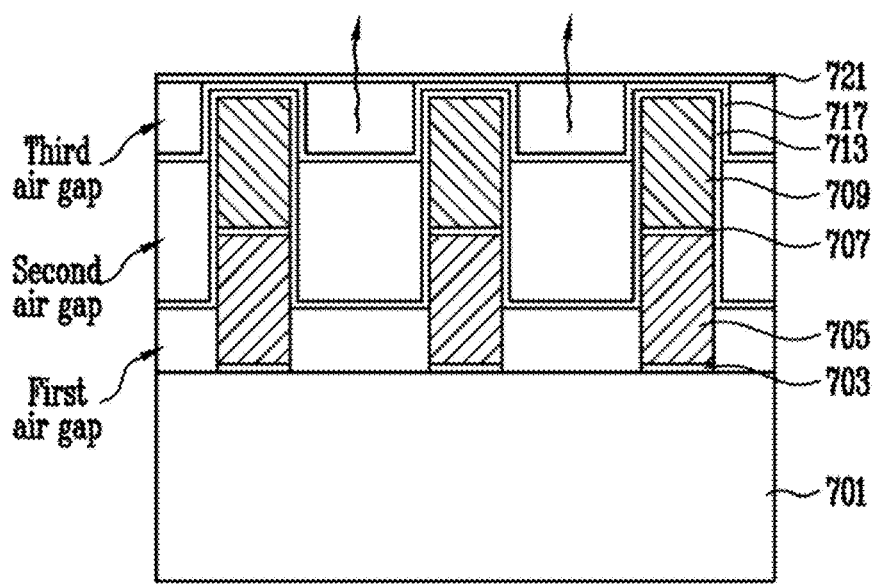

Referring to FIG. 7H, the third sacrificial layer (reference number 719 of FIG. 7G) under the third capping layer 721 is removed by using plasma. For example, plasma may be generated inside a chamber in which the semiconductor substrate 701 is loaded. For example, oxygen, nitrogen, or hydrogen plasma may be generated. When the plasma is generated, the third sacrificial layer 719 passes through the third capping layer 721 to exit to the outside, as described above with reference to FIG. 3. A space from which the third sacrificial layer 719 is removed becomes a third air gap. The third air gap is formed on the second capping layer 717 and has a width that is narrower than a width of the second air gap.

Figure 7I:
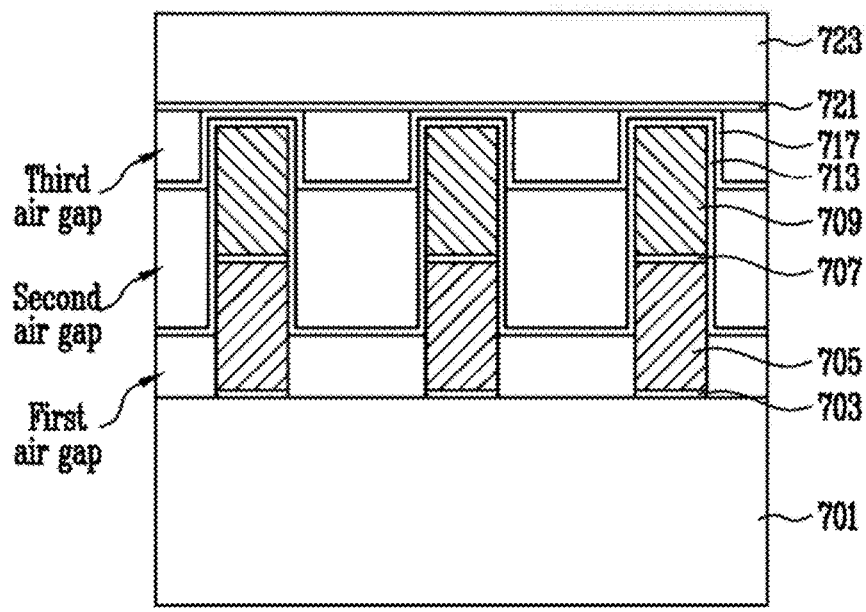

Referring to FIG. 7I, an interlayer insulation layer 723 is formed on the third capping layer 721, and then a subsequent process performed. The first to third capping layers 713, 717, and 721 serve as supports between the gate lines GL. That is, if the first to third capping layers 713, 717, and 721 where to be removed, so that only a single air gap remained, then the gate lines GL may lean in a side direction. Accordingly, it is simultaneously possible to suppress interference between the gate lines GL and prevent the gate lines GL from leaning.

Figure 8:
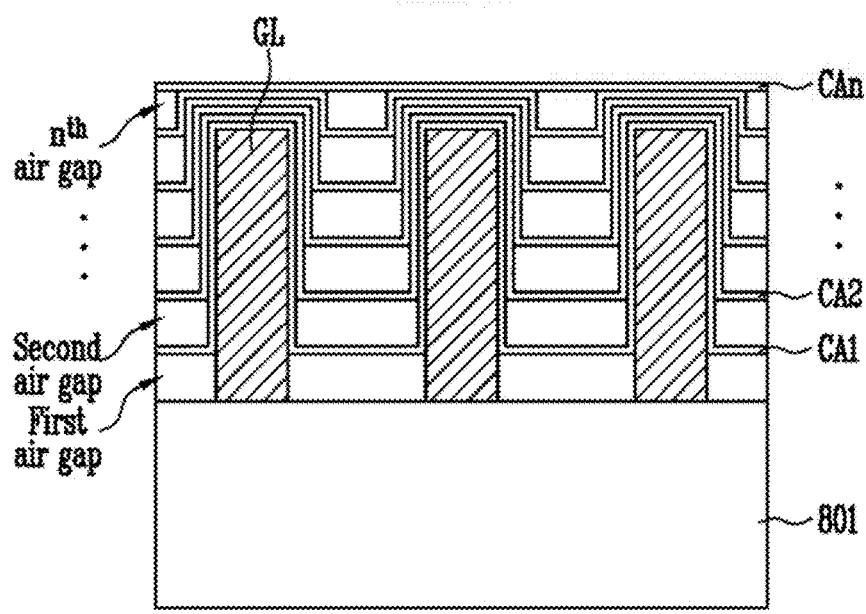
FIG. 8 is a cross sectional view illustrating a method of manufacturing an exemplary semiconductor memory.

In FIGS. 7A to 7I, show three air gaps are formed between the gate lines GL, but, as shown in FIG. 8, any number (n) of air gaps may be formed between the gate lines GL. Reference numeral 801 in FIG. 8 denotes a semiconductor substrate, and CA1 to CAn indicate first to $n^{th}$ capping layers. As illustrated in FIGS. 7I and 8, it is possible to prevent the gate lines GL from leaning and more effectively suppress interference between the gate lines GL, by forming the air gaps to be higher than the upper surfaces of the gate lines GL.

As described above, an exemplary embodiment has been disclosed in the drawings and the specification. The specific terms used herein are for purposes of illustration, and do not limit the scope of the present invention recited in the claims. Accordingly, those skilled in the art will appreciate that various modifications and other equivalent examples may be made without departing from the scope and spirit of the present disclosure. Therefore, the sole technical protection scope of the present invention will be defined by the technical spirit of the accompanying claims.

What is claimed is:

1. A method of manufacturing a semiconductor memory device, the method comprising:
    forming a tunnel insulation layer and a floating gate on a semiconductor substrate of an active region;
    forming a trench in the semiconductor substrate of an isolation region;
    forming in the trench, a sacrificial layer having an upper surface positioned higher than a surface of the semiconductor substrate;
    forming a capping layer over the sacrificial layer to completely cover the upper surface of the sacrificial layer;
    forming an air gap at a bottom region of the trench by removing the sacrificial layer without removing the capping layer,
    forming an insulation layer on the capping layer after forming the air gap, and
    etching the insulation layer so that only a portion of the insulation layer remains in the isolation region over the capping layer, wherein forming the sacrificial layer comprises:
    filling the trench with the sacrificial layer;
    solidifying the sacrificial layer by performing a heat treatment process; and
    etching the sacrificial layer so that the upper surface of the sacrificial layer is positioned higher than the surface of the semiconductor substrate.

2. The method of claim 1, where the sacrificial layer is a flowable material containing carbon.

3. The method of claim 2, where the sacrificial layer is a Spin-On-Carbon (SOC) layer or a photoresist (PR) layer.

4. The method of claim 2, further comprising:
    forming the sacrificial layer by spin coating.

5. The method of claim 1, where etching the sacrificial layer further comprises: etching the sacrificial layer so that the upper surface of the sacrificial layer is about 50 A° to about 150 A° higher than the surface of the semiconductor substrate.

6. The method of claim 1, further comprising:
    forming a lower insulation layer in a lower portion of the trench before forming the sacrificial layer in the trench.

7. The method of claim 6, where the lower insulation layer is formed of a flowable material.

8. The method of claim 7, where the flowable material is a polysilazane (PSZ).

9. The method of claim 6, where forming the lower insulation layer further comprises:
    solidifying the lower insulation layer by performing a heat treatment process; and
    etching the lower insulation layer so that an upper surface of the lower insulation layer is lower than the surface of the semiconductor substrate.

10. The method of claim 9, where etching the lower insulation layer further comprises:
   etching the lower insulation layer to be about 100 Å to about 400 Å lower than the surface of the semiconductor substrate.

11. The method of claim 1, where the capping layer is formed of a non-porous material.

12. The method of claim 11, where the non-porous material includes a silicon dioxide (SiO2), a silicon nitride (SiN), a silicon oxynitride SiON, or a silicon carbide nitride (SiCN).

13. The method of claim 1, where the capping layer is formed by atomic layer deposition (ALD) method at a low temperature.

14. The method of claim 13, where the low temperature includes a temperature range of about 50° C. to about 100° C.

15. The method of claim 1, where the capping layer has a thickness of about 5 Å to about 50 Å.

16. The method of claim 1, where removing the sacrificial layer further comprises:
   removing the sacrificial layer via plasma.

17. The method of claim 16, where the plasma is an oxygen, a nitrogen, or a hydrogen plasma.

18. The method of claim 1, where the insulation layer is formed of a flowable material.

19. The method of claim 18, where the flowable material is a polysilazane (PSZ) layer.

* * * * *